United States Patent [19]

Schimanski

[11] Patent Number: 5,204,912

[45] Date of Patent: Apr. 20, 1993

[54] DEFECT VERIFICATION AND MARKING SYSTEM FOR USE WITH PRINTED CIRCUIT BOARDS

[75] Inventor: Freddie G. G. Schimanski, Madison, Conn.

[73] Assignee: Gerber Systems Corporation, South Windsor, Conn.

[21] Appl. No.: 749,479

[22] Filed: Aug. 15, 1991

Related U.S. Application Data

[63] Continuation of Ser. No. 485,138, Feb. 26, 1990, abandoned.

[51] Int. Cl.⁵ .............................................. G06K 9/00
[52] U.S. Cl. ....................................... 382/8; 358/101; 358/106; 356/237
[58] Field of Search ................... 382/8; 358/101, 106; 356/237; 364/507

[56] References Cited

U.S. PATENT DOCUMENTS

| | | | |
|---|---|---|---|
| 3,759,620 | 9/1973 | Cushing et al. | 356/200 |
| 3,988,530 | 10/1976 | Ikegami et al. | 178/6 |
| 4,189,337 | 2/1980 | Higgins et al. | 156/351 |
| 4,295,198 | 10/1981 | Copeland et al. | 364/515 |
| 4,541,011 | 9/1985 | Mayer et al. | 358/106 |
| 4,561,921 | 12/1985 | Treiber | 156/297 |
| 4,578,810 | 3/1986 | MacFarlane et al. | 382/8 |
| 4,692,799 | 9/1987 | Saitoh et al. | 358/106 |
| 4,758,782 | 7/1988 | Kobayashi | 324/73 PC |
| 4,783,826 | 11/1988 | Koso | 382/8 |
| 4,799,175 | 1/1989 | Sano et al. | 364/552 |
| 4,881,269 | 11/1989 | Billiotte et al. | 382/8 |
| 4,908,871 | 3/1990 | Hara et al. | 382/8 |
| 4,918,739 | 4/1990 | Lorente et al. | 382/1 |
| 4,924,505 | 5/1990 | Leberl et al. | 382/8 |
| 4,978,220 | 12/1990 | Abramovich et al. | 356/394 |

OTHER PUBLICATIONS

The AOI-19 Inspection System (brochure),-AOI Systems, Inc., Mar. 1988.
Ragen 3600 (brochure),-Ragen Systems, Inc., (no date).
Automated Cartesian Workstation-ACW-300 (brochure),-DCI, 1989.
Precise 3000 (brochure),-View Engineering, Inc., 1989.
Optek 102 (brochure),-Operations Technology, Inc. (no date).
Orbot VRS-1 and VRS-2 (brochure),-Orbot, Inc., 1989.
Orbot VRS-3 (brochure),-Orbot, Inc., 1989.
AVSI 8700 (advertisement),-Applied Vision Systems, Inc., Jan. 1989.
Projectina PC/VRS-Servo (brochure) (no date).
Optimar-2 (advertisement), Optimar Instrument Co. (no date).
V-SCAN (brochure), Multiline Technology (no date).
Automove 403 (brochure),-Asymtek, May, 1988.

*Primary Examiner*—Leo H. Boudreau
*Assistant Examiner*—Andrew W. Johns
*Attorney, Agent, or Firm*—McCormick, Paulding & Huber

[57] ABSTRACT

A system is provided for verifying defects in a printed circuit board (PCB). The system includes a base and a gantry apparatus affixed to the base. The gantry apparatus has first and second positioning apparatus adapted to move in perpendicular directions in a locating plane in response to control signals. A platen is located on a table on the base and is adapted to move from a first position extending from the base to a second position in registration with the positioning apparatus in a plane parallel to the locating plane. The platen is further adapted to receive the PCB, and includes an alignment mechanism to register the PCB with a preferred position thereon. An optical viewing assembly is mounted with the positioning mechanism for providing an optical image of a selected location of the PCB. The system also includes a controller for receiving signals identifying the PCB and selecting an associated data file from a computer memory having signals therein indicative of the address of the defects on the PCB. The controller provides control signals to the positioning mechanism to locate the optical viewing assembly at the address of a selected one of the defects.

11 Claims, 5 Drawing Sheets

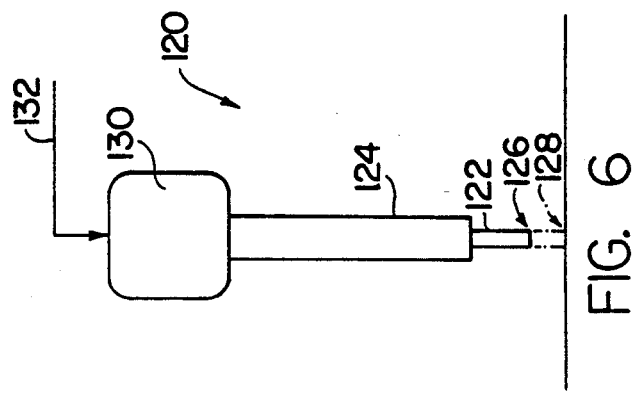
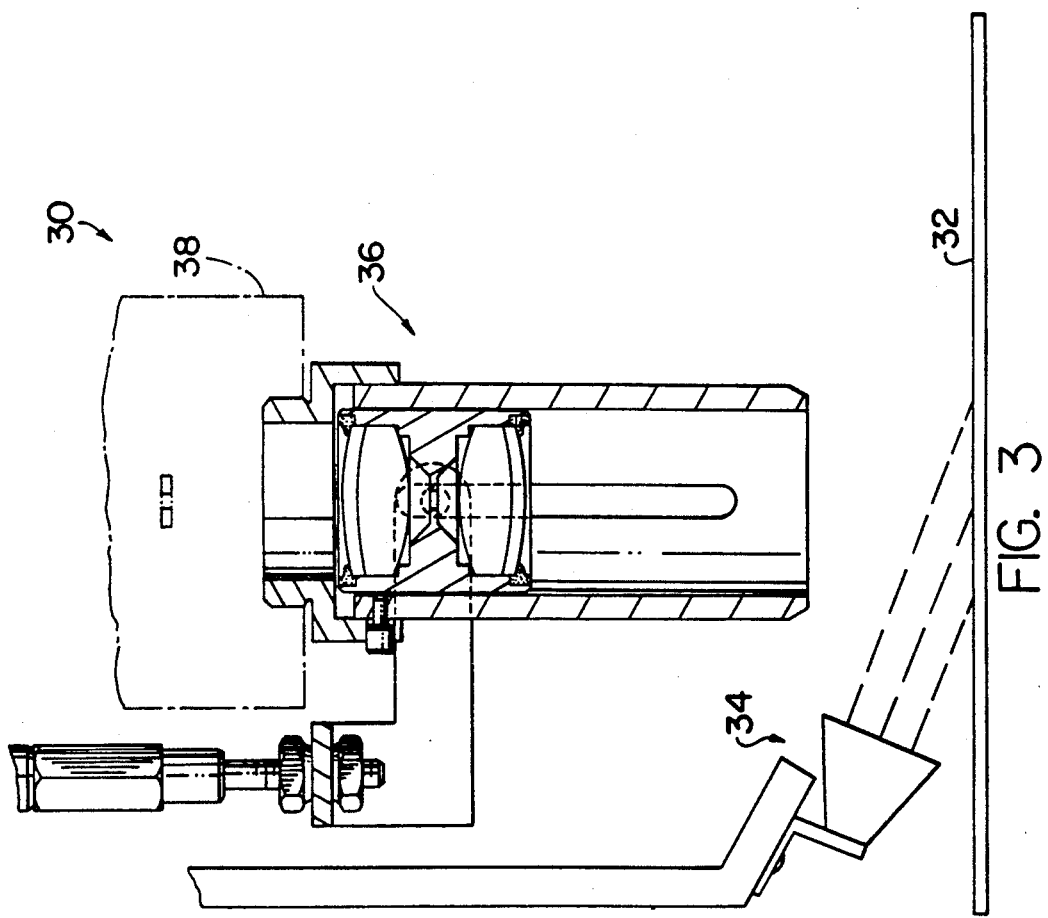

DEFECT VERIFICATION AND MARKING SYSTEM FOR USE WITH PRINTED CIRCUIT BOARDS

This is a continuation of co-pending application Ser. No. 07/485,138 filed on Feb. 26, 1990, now abandoned.

TECHNICAL FIELD

This invention relates to an apparatus for optically inspecting pattern images for defects and more particularly to a system for verifying and marking defects on printed circuit boards.

BACKGROUND OF THE INVENTION

Printed circuit boards (PCB) are used extensively throughout the electronics industry. Defects in a PCB are the result not only of problems in fabrication, but also from errors in features found in the artwork used therein. Over time, printed circuit boards have become very complex, with an increasing number of layers each having ever higher densities of electrical components. The defects which occur during production are therefore correspondingly more difficult to identify by manual inspection. Manual inspection by workers is a very costly process with uneven results. Each board must be handled individually by a worker who must locate and analyze each defect.

As a result, a series of computer based systems have been developed to optically inspect each printed circuit board for defects. PCB artwork sometimes is inspected by these systems as well. Typically, the optical inspection occurs at the end of the fabrication of each PCB layer. Known optical inspection systems, such as that disclosed in U.S. Pat. No. 4,578,810 optically scan a printed circuit board and compare the image thereof against a reference image stored in computer memory. Should a defect be noted, the known systems will record the approximate size and location thereof on the printed circuit board in a data file. Certain ones of these systems will position a camera or other optical inspection device over the defect to allow for examination by a worker.

However, these known systems are not able to accurately categorize the defects found on a printed circuit board to automatically determine whether the board must be rejected offhand, or whether the defects are of a type, magnitude and location that they may be repaired. For example, excess material can be removed from a metalized printed circuit board, but missing material which translates into electrical opens on a printed circuit board are rarely repaired. Consequently, it is still necessary that a worker visually inspect each board to determine the full extent and type of the damage which has been previously identified by the automatic defect inspection system.

Computer based systems of this type are referred to as verification stations or inspection stations and are marketed by the AOI Systems, Inc. company of Balowa, Mass., the Multi-Line Technology company of Farmingdale, N.Y. and the Operations Technology, Inc. of Blairstown, N.J. These known verification stations are characterized by a controller which receives a data file containing the digitized defect information obtained during an earlier scan of that printed circuit board by a defect detection system as detailed above. The controller generates signals for a mechanism that moves the printed circuit board relative to an optical microscope or camera so that the microscope is positioned over a defect, allowing for direct visual inspection or viewing via a television monitor.

The worker views each defect identified by the defect detection systems in sequence and determines whether the PCB can or cannot be repaired. A PCB that cannot be repaired is rejected outright. The printed circuit boards which can be repaired must also be marked in some manner as to the location of the defect(s). Moreover, certain defects are of such a small magnitude that no repair work is necessary. This determination can only be made by the worker after visual inspection.

In a high volume production environment, the costs associated with verification can assume a substantial portion of the total cost of the board. Every step in the verification process which is simplified or eliminated without a corresponding reduction in accuracy or speed results in a substantial savings in manufacturing cost. As the verification procedure must take place for each printed circuit board which is found to have at least one defect, the design of the verification station has a dramatic effect on the final cost of the printed circuit board.

Known verification stations are slow and are not adapted to be integrated into a fabrication line. The time required for a worker to manually handle and position each PCB and verify the defects thereon is substantial. Moreover, these verification stations require a separate facility for accomplishing repairs to a board or allow for a repair to be performed only awkwardly.

It would be advantageous to have a verification station which is low in initial cost and would be especially adapted to allow speedy identification of defects on a printed circuit board and allow for an inexpensive and accurate repair thereof. The present verification system is drawn towards such an invention.

SUMMARY OF THE INVENTION

An object of the present invention is to provide for a verification station which is capable of allowing an operator to directly repair defects on a printed circuit board.

Another object of the present invention is to provide a verification system of the foregoing type which is low in initial cost and which is adapted to be integrated into a printed circuit board fabrication line.

According to the present invention, a verification system for verifying defects in a printed circuit board (PCB), with each of the defects having an address on the PCB, the system includes a base and a gantry apparatus affixed to the base. The gantry apparatus has first and second positioning apparatus adapted to move in perpendicular directions in a locating plane in response to control signals. A table is affixed to the base under the positioning apparatus. A platen is located on the table adapted to move from a first position extending from the base to a second position in registration with the positioning apparatus in a plane parallel to the locating plane. The platen is further adapted to receive the PCB and includes an alignment mechanism to register the PCB with a preferred position thereon. An optical viewing assembly is mounted with the positioning apparatus for providing an optical image of a selected location of the PCB. The system also includes a controller for receiving signals identifying the PCB and selecting an associated data file from a computer memory having signals therein indicative of the address of the defects on the PCB. The controller will, in response to command signals, provide control signals to the positioning apparatus to locate the optical viewing assembly at the address of a selected one of the defects.

According to another aspect of the present invention, a marking apparatus for use with a system for verifying defects in a printed circuit board (PCB), the system having a platen for receiving the PCB and a positioning mechanism for moving an optical viewing assembly relative to said PCB in a plane above said PCB, includes a support mechanism affixed to the positioning mechanism for allowing the apparatus to move with the optical viewing assembly. A wand is affixed to the support mechanism and has a tubular tip extending therefrom. The marking apparatus further includes first and second reels located on the support mechanism adjacent to said wand which are adapted to receive a tape having a continuous backing and a series of markers removably affixed thereto. A mechanism is provided for rotating the tip from a first position in registration with a first one of the markers to a second position in registration with a defect on the PCB surface. A mechanism is also provided for extending and retracting the tip in response to control signals to contact the first one of the markers and the PCB surface. A mechanism is provided for presenting a vacuum to the tip upon contacting the first one of the markers and for removing the vacuum upon contacting the PCB surface.

BRIEF DESCRIPTION OF THE DRAWINGS

FIG. 3 is a simplified schematic illustration of an optical viewing assembly used with the verification system of FIG. 1.

FIG. 6 is a simplified schematic illustration of an ink marking device 120 provided according to the present invention.

DESCRIPTION OF THE PREFERRED EMBODIMENT

Figure 1:
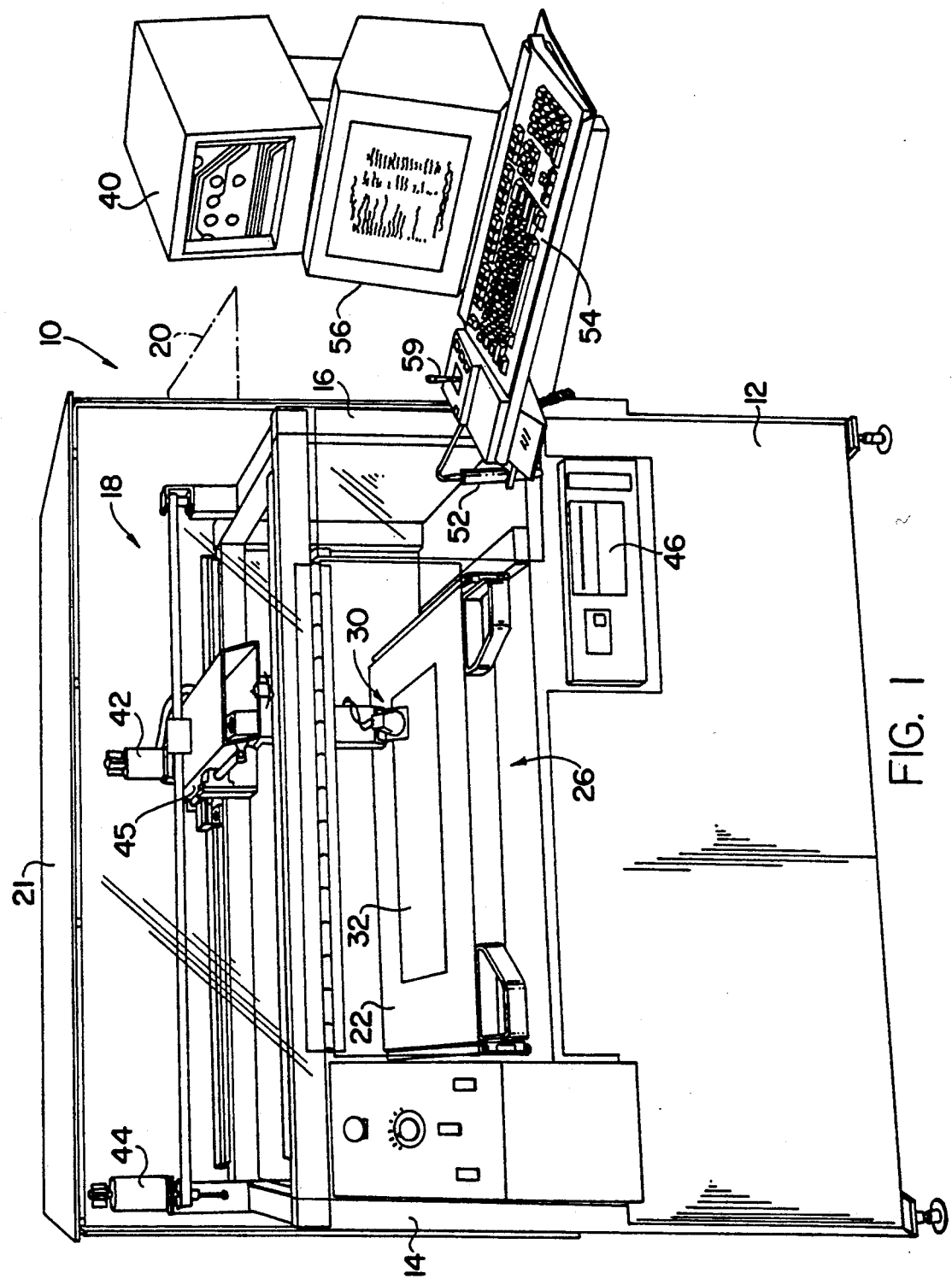
FIG. 1 is a perspective illustration of a verification system provided according to the present invention.
Figure 2:
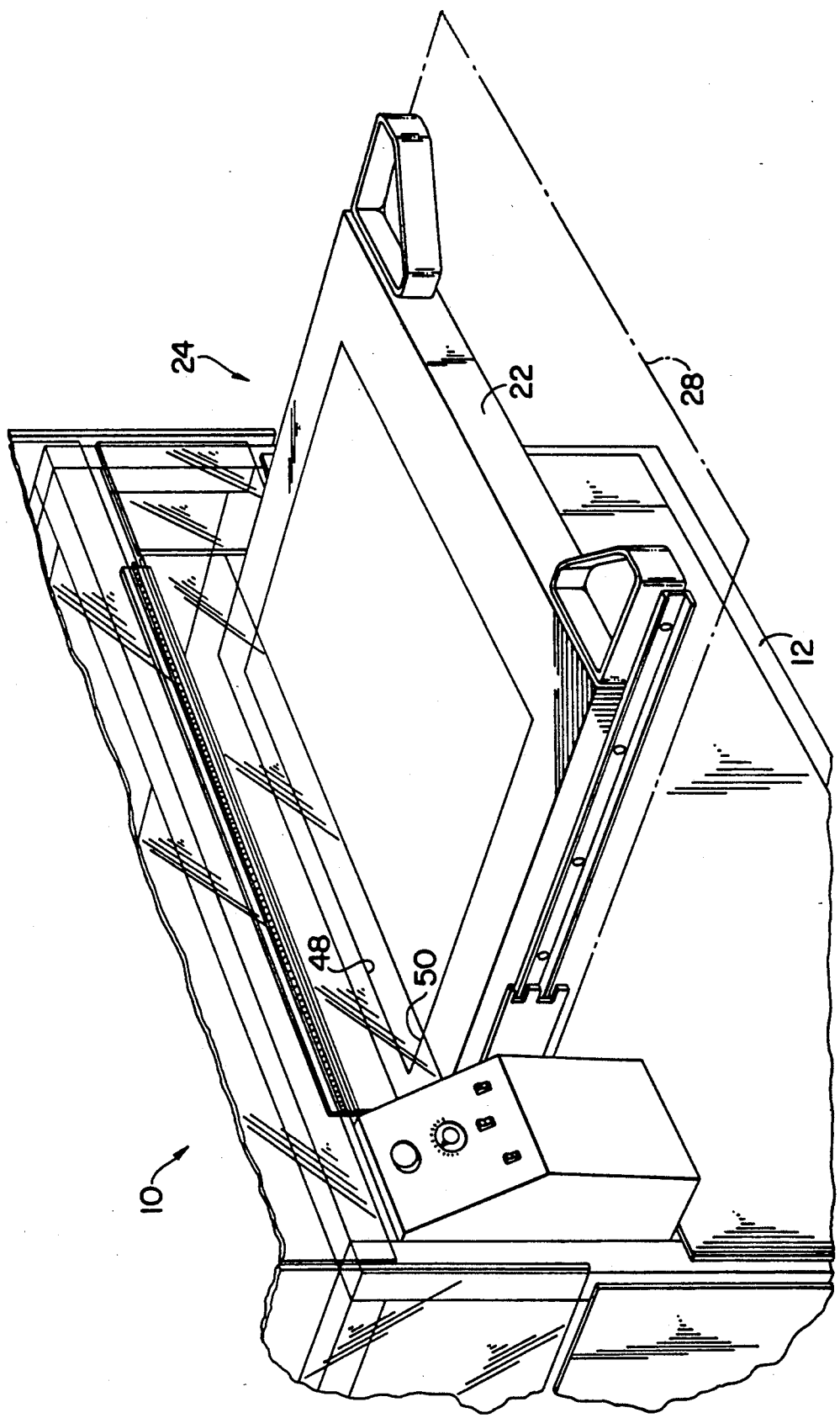
FIG. 2 is a sectional perspective illustration of a portion of the verification system of FIG. 1.

Referring now to FIGS. 1 and 2 there is schematically shown a verification system 10 provided according to the present invention. The system 10 includes a base 12. The base has a plurality of support members 14 and 16 which receives a gantry type locating element 18. The locating element 18 is adapted to move in a plane 20. A plexiglass cover 21 encloses the locating element to keep dirt and contamination out and acts to prevent injury from accidental contact with the moving parts of the locating element. The present verification system is characterized by a platen 22 adapted to move between first and second positions 24 (FIG. 2) and 26 (FIG. 1) in a plane that includes table surface 28. The second position 24 is shown in FIG. 2, and is with the platen extending outward from the base, while the second position is with the platen in registration with the locating element. When the platen is in the first position, an optical viewing assembly 30 affixed to the locating element is capable of examining a printed circuit board 32 or printed circuit board artwork positioned on the platen. Although adapted to receive a PCB in the preferred embodiment, those skilled in the art will note that the platen can readily be adapted to receive PCB art work. In such case the platen may comprise a grid of holes or openings therein configured with an interior cavity that is connected to a vacuum source. Application of the vacuum to the platen holds the PCB artwork in place. Equivalently, an electrostatic device of a known design may be substituted.

As shown in FIG. 3, the optical viewing assembly 30 comprises a high intensity light source 34 with a reflector of a known design. The light source illuminates the printed circuit board 32. Light reflected therefrom is focused by a lens assembly 36 and is passed to a television camera 38 such as a Sony model XC-711. The image formed in the television camera is converted in a known manner and displayed on a monitor 40 located at one side of the system. In this manner, a defect located directly underneath the optical viewing assembly can be viewed directly by a worker. The components of the optical assembly are capable of either 10× or 40× magnification. More powerful lenses may be substituted as desired. The optical viewing assembly has a depth of field sufficient to maintain focus on warped PCBs as much as ½ mil per linear inch of length.

The gantry type locating element 18 comprises stepper motors 42 and 44 which are configured to move the optical viewing assembly in response to signals provided thereto. Although preferably operated in an open loop manner, those skilled in the art will note that the locating element 18 can include feedback sensors to enable the present verification system to be operated in closed loop manner with servodriven systems. The locating element also comprises pullies, gears and other known apparatus of a type sufficient to accomplish the functions herein, including moving the optical viewing element in both the X and Y directions in plane 20. The mass of the locating element should be as low as possible. To this end, supports 45 are made from extruded aluminum.

The verification system 10 is characterized by a controller 46 which receives digital signals indicative of defects in PCB 32 which are observed in a prior analysis by a defect detection system, such as the Model 1850 defect detection system marketed by the Gerber Scientific Instrument Company, the assignee of the present application. The controller comprises a IBM PC/AT type central processor unit (CPU) or its equivalent. Either 3.5 inch or 5.25 inch floppy disc drives are included as is a 20–40 Mbyte hard drive for storage. The controller has between 640 and 1 Mbyte of random access memory (RAM), as well as a graphics capability. A 3COM ethernet Card or its equivalent is included with a serial port for receiving bar code data signals. The worker accesses the controller via keyboard 54 and monochrome monitor 56.

The present verification system is designed for integration with PCB fabrication lines and to be optimized for both speed and accuracy. For example the system 10 allows for access, review and resolution of a given defect on a PCB in less than 30 seconds. In the preferred embodiment, the time needed to access a defect does not exceed 2 seconds. Most importantly, the time needed to load and unload a PCB is less than 5 seconds.

The above performance parameters are accomplished by the design of the various components. For example the sliding two position platen eliminates the need for worker movement from a sitting position in front of the base that would other wise be required to accomplish the loading/unloading of a PCB and/or the input of command signals at the keyboard. The preferred platen is adapted to receive PCB or other articles ranging in size from 12"×16" to 22"×28". The preferred thickness range being between 0.004" (graphics art film) to 0.25" (glass plates). The platen is preferably translucent to allow for backlighting.

In operation, the worker operating the verification system 10 will receive several PCBs which have been previously determined to have defects. A PCB is selected and placed on the platen when it is in the first position. To speed the process, the platen has an alignment mechanism, typically perpendicular edges 48, 50 which are adapted to receive corresponding edges of the PCB. The PCB may be held in place by vacuum or other conventional holding means, such as an electrostatic device used for PCB artwork. Alternatively, the platen may include guide pins adapted to be received by associated guide holes in the PCB.

To further speed verification, each PCB is indentified by a bar code tag affixed thereto earlier during fabrication. A bar code reader 52 is used by the worker to scan the tag and identify the particular PCB to the controller. The platen is then slid into the base to the second platen position. The controller will, in response to a prompt from the worker from the keyboard, generate command signals for the stepper motors to move the locating element so that the optical viewing assembly is in registration with a defect on PCB 32. In the preferred embodiment, the controller prioritizes the defects according to size (area) and automatically selects the defects from largest to smallest.

The controller will then wait for a command from the worker to either proceed to the next defect or to proceed to the next printed circuit board. If desired, the controller will continuously mark each of the defects on a PCB for subsequent review after completion of the verification process. The present system allows for a quick examination of what has been previously determined to be the most serious defect, since a defect above a certain magnitude or a certain type (e.g. an "open") will mean that the PCB is unrepairable and must be scrapped. No time is wasted with the present system in examining defects which by themselves are repairable, but are rendered irrelevant because of the presence of a very large or specific type of defect. In addition, the present system allows the worker to quickly and efficiently move the board from the second position back to the first position for repair, if desired, and continue on to the next defect. Neither the PCB nor the worker need move during this process, eliminating wasted time in effecting a repair or in realignment of the PCB on the platen. In contrast, prior art systems require both that the worker and the PCB move. Those skilled in the art will note that the present system includes additional components, such as the moveable platen, which add to the cost of the system. In a very cost sensitive market, additions to unit cost are to be scrupulously avoided. However, the present invention demonstrates simultaneous improvements in both the speed and the accuracy of the verification process of an unexpectedly large magnitude.

The present system also includes a toggle control or joystick 59. The joystick is of a known type and provides electrical signals for the controller which generates corresponding command signals for the stepper motors for rastering the locating element about the plane 20 thereby enabling the worker to manually move the optical viewing assembly and inspect other areas of the printed circuit board. In the preferred embodiment, the table height and the location of other worker input devices are selected to ensure worker comfort to maximize speed and efficiency. In that regard, table height is at 28 inches from the ground. The location of the keyboard and monitors are placed opposite the free work area of the operator within reach and sight of the operator, eliminating the need for the worker to move from an initial position at the station.

The present system also comprises a marking mechanism 58 for use in marking defects on the printed circuit board or artwork with either ink or preferably a removable tag to enable subsequent location by the worker. The marking mechanism is affixed to the locating element adjacent the optical viewing assembly and moves therewith. The controller is configured as detailed hereinafter to mark each defect in accordance with the severity of the defect. For example, multiple tags or ink marks can be used to indicate the most severe defect.

Those skilled in the art will note that photoplotted artwork cannot be "inked" if it is to be retouched and used. A separate device of the type detailed below is needed on the inking head which will affix an adhesive indicator to the artwork. PCB cores having photo resist thereon may be similarly marked. Note further that, in contrast to metalized parts, missing material can be added to the artwork using opaque markers, but excess material cannot be removed.

Figure 4:
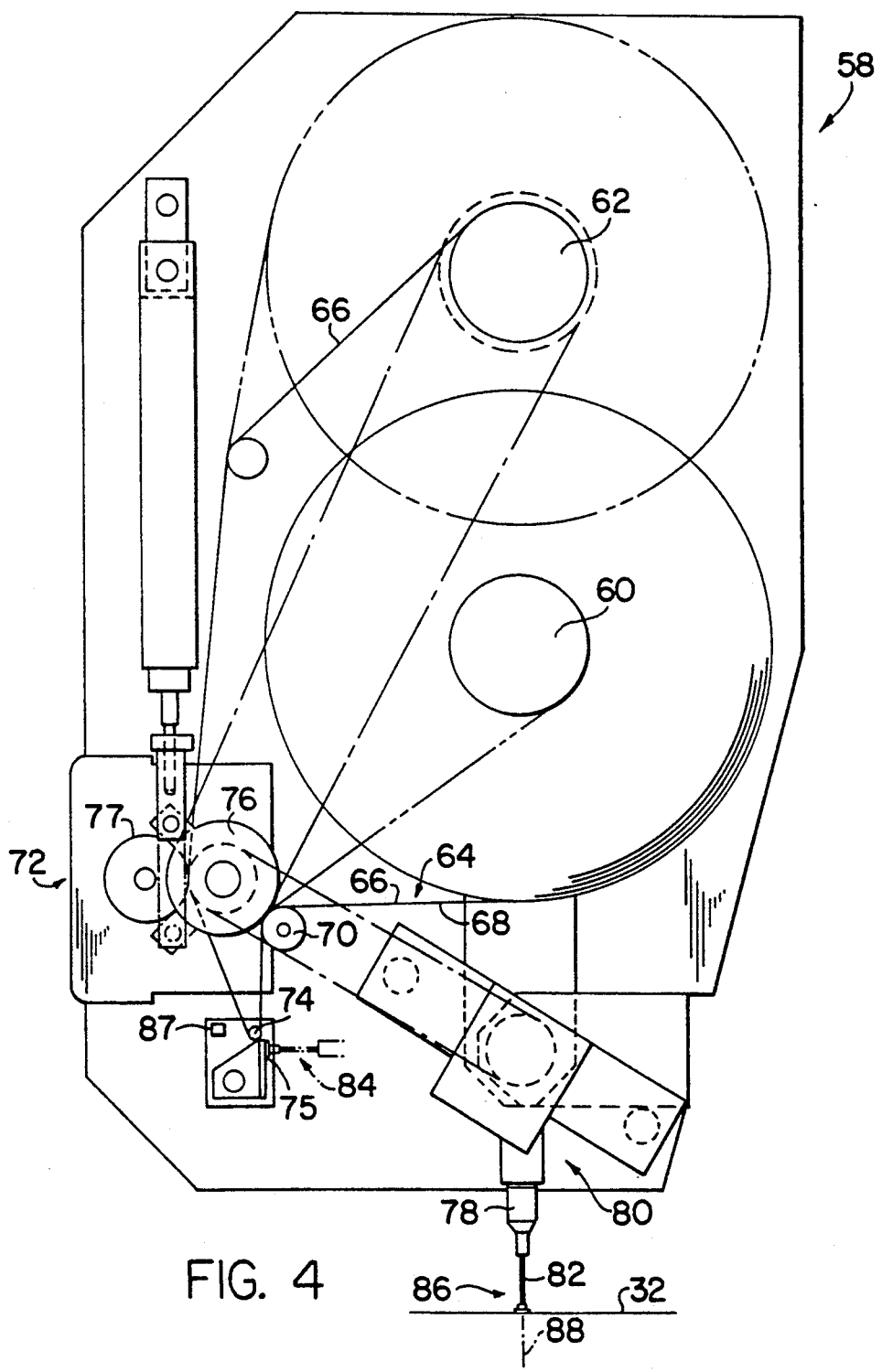
FIG. 4 is a simplified schematic illustration of a defect marker used with the verification system of FIG. 1.

Referring now to FIG. 4 there is shown a schematic illustration of the marking mechanism 58. The defect marker comprises first and second reels 60 and 62 adapted to receive a two part tape 64. The tape is comprised of a continuous backing 66 and a sequence of markers or tags 68 arranged there along. The markers have an adhesive on an inner surface which contacts the baking. The tape 64 is located initially on reel 60 and is fed through roller 70 towards a indexing mechanism 72 having a roller or post 74 for moving the tape at an extreme angle such that marker 75 extends directly therefrom. The continuous backing passes over the rollers 76 and 77 and is received ultimately by the takeup reel. The indexing mechanism is configured to advance the tape only a select amount to present a new marker at roller 74 in response to command signals.

The marking mechanism also includes a wand 78 mounted on a locating apparatus 80. The wand has a longitudinal tip 82, preferably tubular, and is connected by conventional means to a vacuum source not shown and not part of the present invention. The locating apparatus 80 moves the wand in response to command signals from the controller, rotating it between first and second positions 84, 86 and displacing the tip along an axis 88 coincident therewith between extended and retracted positions. In the preferred embodiment, the indexing mechanism is configured to drive the locating apparatus 80 by means of an electromechanical clutch, pulleys and other known mechanical elements. The indexing mechanism simultaneously advances the tape to present the marker 75 as shown in FIG. 4, and rotates the wand between the first and second positions 84, 86 to complete one cycle of the indexing mechanism.

At the first wand position, the wand is in registration with the marker 75. The controller provides signals to the wand enabling a vacuum to be presented to the tip and for extending the tip outward to contact the marker 75. Optical sensor 87 provides feedback signals to the controller to indicate when a marker is in position to be received by the tip. The marker is affixed to the tip via the vacuum and remains therewith when the controller subsequently presents signals to the wand to retract the tip and rotate to the wand second position. The controller then sends signals to the marking mechanism to advance the takeup reel a preselected amount to position another marker to be received by the tip.

The wand is rotated to the second position as detailed above. The controller also generates signals to displace the locating element 18 to register the tip and marker with the effect. The controller provides the wand with signals to first extend the tip to contact the surface of the PCB and then remove the vacuum. In this manner the marker is affixed to the PCB at the position of the defect and remains due to the effect of the adhesive. Not shown is a pressure sensor for detecting the presence of a vacuum at the tip. Signals therefrom alert the controller that a marker has been successfully retrieved from the tape and that the marker has been deposited on the PCB.

FIG. 6 is a simplified schematic illustration of an ink marking device 120 provided according to the present invention. The device includes an ink marker 122 affixed to plunger 124 having an internal spring (not shown). The marker is moved between first and second positions 126, 128 by means of a solenoid 130 which receives control signals from the controller on line 132. An ink marker is left on the PCB to indicate the position of the defect. The ink marking device is configured with the optical viewing assembly in a known manner, as is the marking mechanism 58.

Figure 5:
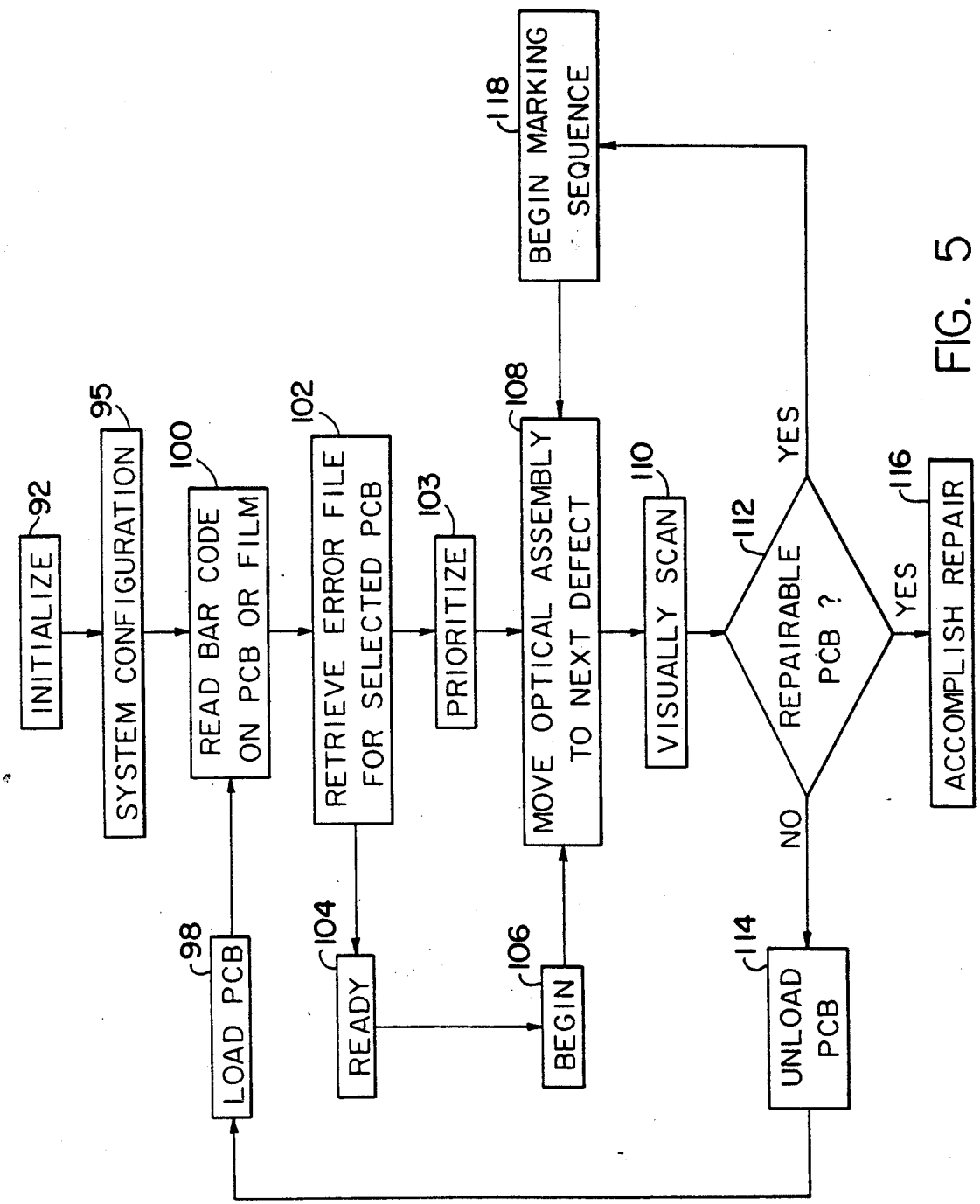
FIG. 5 is a diagram of an algorithm executed by a controller found in the verification system of FIG. 1.

Referring now to FIG. 5 there is shown a diagram of an algorithm 90 executed by the present controller. At block 92 the controller is initialized; a process which occurs upon initial start up. The operator will set the "0/0" point on the PCB and will be independently able to slew to a position via the joystick. At block 95, the worker presents to the controller the configuration parameters such as the types of errors to be classified.

A PCB is loaded on to the platen (block 98) by the worker who uses the bar code reader (Block 100) to quickly and without error provide the controller with the identification of the selected PCB. The controller, at block 102, retrieves from memory associated therewith the data file containing the defect information for the PCB previously obtained in the manner described hereinabove. The datafile contains the X and Y coordinates of the defects. Alternatively, the controller may obtain the data file directly from the defect detection system via an Ethernet local area network (LAN). The preferred protocol is NFS, using a SUN PC/NFS implementation. For this embodiment, the controller includes the appropriate hardware (3COM PC-NFS-3C-51 board). Data containing the errors detected during the inspection process on the defect detection system are sent via the LAN to the present system as requested.

In the preferred embodiment, the controller includes an algorithm for comparing the areas of the defects and prioritizes the defects in accordance therewith, from the largest to the smallest. The controller will automatically present the worker with the defects in this order (block 103). The controller then presents the worker with a ready signal (block 104) at the monitor. The worker prompts (Block 106) the controller to move to the first defect (Block 108). As noted above, the defects are prioritized according to size with the largest in area being the first presented to the worker. The manner in which the locating element and optical viewing assembly are moved is also detailed above. The worker then visually scans (block 110) the area of the PCB having the defect for analysis.

The present controller provides the worker with a menu for the verification operation. Table 1 contains the menu options along with a brief description thereof.

TABLE 1

| | |
|---|---|
| SCRAP, not salvageable | |
| REPAIR EXCESS MATERIAL, | Class 1 - (Indicates a major, albeit repairable, error. Invocation of this selection automatically activates the defect-marker. A Class 1 error is stamped twice with a five mil offset.) |
| REPAIR EXCESS MATERIAL, | Class 2 - (Indicates a general condition minor error. Also activates the defect-maker. A Class 2 error is stamped once. Within the Class 2 defect, the user can further describe the particular type of error by more descriptive menu selections. These follow.) |
| REPAIR MISSING MATERIAL, | Class 1 |
| REPAIR MISSING MATERIAL, | Class 2 |
| SPECIFIC DEFECT TYPES | Pinhole |
| (These categories may be used to develop an SPC database) | Breakout |
| | Spurious copper |
| | Embedded contaminant |
| | Trace width/spacing violation |
| | Striated glass/material fiber |
| | Spurious copper |
| | Mousebite |
| | Nick or spur |
| | Trace delamination |
| | Open trace |
| | Short |
| | Epoxy void |
| | Necking |
| MISREGISTRATION | |
| NO ERROR | |
| (Indicates a false error condition) | |

Should the defect be of a size or type or have features which would render the board unrepairable (block 112), the worker will, at block 114, unload the PCB and select another. Should the PCB defect the deemed repairable, the worker may either slide the platen out from the base and effect repairs immediately (block 116) or instruct the controller via the keyboard to mark the defect for later repair (block 118).

The present controller includes a diagnostic algorithm for providing a self-test to check for proper hardware function. A built in test (BIT) program serves to provide an indication to the worker that the controller and other elements of the system are functioning properly. In addition, the present controller includes an algorithm to allow the worker to sort/classify errors as detailed above. A data file containing this information for the present PCB is presented to the defect detection system (e.g., Gerber 1850) file server. Those skilled in the art will note that the statistical information can then be used to create a database of PCB defects to aid in the fabrication process. The PCB error file can be downloaded on to disc storage or may be transferred directly to the defect detection system by means of an Ethernet local area network (LAN) as detailed above.

Similarly, although the invention has been shown and described with respect to a preferred embodiment thereof, it should be understood by those skilled in the art that various other changes, omissions and additions thereto may be made therein without departing from the spirit and scope of the present invention.

I claim:

1. A verification system for use in a printed circuit board (PCB) assembly line, for verifying and permitting repair of defects in a PCB bounded by peripheral edges, each of said defects having an address on an upper planar surface on the PCB, the system comprising:

a base;

a gantry apparatus affixed to said base including a positioning apparatus adapted to move in perpendicular directions in a locating plane in response to control signals:

a table affixed to said base in registration with said gantry apparatus;

a platen located on said table adapted to move only along a single axis from a first position extending from said base such that the PCB upper planar surface is misregistered relative to said positioning apparatus and unobstructed thereby to a second position in registration therewith in a plane parallel to said locating plane, said platen further adapted, at a surface thereof, to receive the PCB and including an alignment means to register with and fixedly hold the PCB at a preferred position thereon, said platen further configured relative to said base and said positioning apparatus to enable a worker to load, unload and repair said PCB on said platen in said first platen position and present command signals to said controller from a single worker position;

an optical viewing assembly affixed to said positioning apparatus for providing electrical signal equivalents of an optical image of a selected location of the PCB when the PCB is on said platen in said preferred position and said platen is in said second position; and a controller for receiving signals identifying the PCB and selecting an associated data file from a computer memory means having signals therein indicative of the addresses of said defects on said PCB; said controller, in response to command signals, further for providing control signals to said positioning apparatus to position said optical viewing assembly at the address of a selected one of the defects and providing image signals in accordance with said optical viewing assembly electrical signal equivalents, said controller further including a means for initializing the system when said data file is received from said computer memory means such that, thereafter, said platen can be repeatably moved between said first and second positions without re-initialization.

2. The system of claim 1 wherein said platen surface further comprises perpendicular alignment edges at an end corner thereof adapted to receive corresponding peripheral edges of said PCB.

3. The system of claim 1 wherein said platen further comprises a guide pin extending from said surface adapted to be received by an associated hole in said PCB.

4. The system of claim 1 wherein said controller further comprises a keyboard and monitor for respectively receiving controller signals from the worker, and displaying said image signals, said keyboard and monitor affixed to said base at a position adjacent said platen to enable said worker to present and receive said controller signals from said single worker position when said platen is in either of said platen positions.

5. The system of claim 1 further comprising a marking mechanism which, in response to control signals, extends to contact said PCB and retracts therefrom, and wherein said controller provides signals to displace said positioning apparatus by an amount sufficient to enable said marking mechanism to mark said selected one of said defects.

6. The system of claim 1 wherein said controller further comprises means for prioritizing said defects in decreasing area thereof and for providing control signals to said positioning apparatus in accordance with said prioritization.

7. The system of claim 1 wherein said optical viewing assembly includes:

a means for illuminating a portion of said PCB;

a means for focusing light presented to said optical assembly reflected from said PCB; and a means for receiving said focussed light and for providing said electrical signal equivalents of an optical image of said PCB portion.

8. The system of claim 5 wherein said marking mechanism further comprises a wand having a tubular tip extending therefrom;

first and second reels located adjacent said wand and adapted to receive a tape having a continuous backing and a series of markers removably affixed thereto;

a means for rotating said tip from a first position in registration with a first one of said markers to a second position in registration with a defect on said PCB surface; and a means for extending and retracting said tip to contact said first one of said markers and said PCB surface;

a means for presenting a vacuum to said tip upon contacting said first one of said markers and removing said vacuum upon contracting said PCB surface.

9. The system of claim 8 wherein said marking mechanism further comprises a means for receiving and turning said tape through an angle such that said markers are partially removed from said backing when said tip is in said first position.

10. The system of claim 1 wherein said controller further comprises a means for compiling said defect address signals in accordance with pre-arranged categories.

11. The system of claim 5 wherein said marking mechanism comprises an ink marking device.

* * * * *